United States Patent
Boerstler et al.

(10) Patent No.: US 7,333,905 B2
(45) Date of Patent: Feb. 19, 2008

(54) METHOD AND APPARATUS FOR MEASURING THE DUTY CYCLE OF A DIGITAL SIGNAL

(75) Inventors: David William Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/383,570

(22) Filed: May 16, 2006

(65) Prior Publication Data

US 2007/0271051 A1 Nov. 22, 2007

Related U.S. Application Data

(63) Continuation-in-part of application No. 11/380,982, filed on May 1, 2006.

(51) Int. Cl.
*G01R 29/02* (2006.01)
(52) U.S. Cl. ........................................ 702/79
(58) Field of Classification Search ................. 702/75, 702/79, 176; 327/175, 291, 292
See application file for complete search history.

(56) References Cited

U.S. PATENT DOCUMENTS

| | | | |
|---|---|---|---|
| 4,552,118 A | 11/1985 | Fukaya | |
| 4,675,597 A | 6/1987 | Hernandez | |
| 4,814,872 A | 3/1989 | Ivie | |
| 4,859,944 A | 8/1989 | Webb | |
| 4,962,431 A * | 10/1990 | Imakawa et al. | 358/296 |
| 5,367,200 A | 11/1994 | Leonida | |
| 5,933,399 A * | 8/1999 | Kim | 369/47.45 |
| 6,084,452 A | 7/2000 | Drost et al. | |
| 6,150,847 A | 11/2000 | Lu | |
| 6,664,834 B2 | 12/2003 | Nair et al. | |
| 6,700,530 B1 | 3/2004 | Nilsson | |
| 6,798,266 B1 * | 9/2004 | Vu et al. | 327/291 |
| 6,847,244 B2 | 1/2005 | Pillay et al. | |
| 7,002,358 B2 | 2/2006 | Wyatt | |

(Continued)

FOREIGN PATENT DOCUMENTS

EP  0957605 A2  11/1999

OTHER PUBLICATIONS

MAXIM—"Charge Pumps Shine in Portable Designs"; Maxim Application Note 669 (Mar. 15, 2001).

(Continued)

*Primary Examiner*—Michael Nghiem
(74) *Attorney, Agent, or Firm*—D'Ann Rifai; Mark P Kahler

(57) ABSTRACT

The disclosed methodology and apparatus measures the duty cycle of a clock signal. A variable duty cycle circuit receives a clock signal from a clock signal generator. The variable duty cycle circuit adjusts the duty cycle of the clock signal by an amount dependent on a duty cycle index value that it receives. The variable duty cycle circuit supplies a duty-cycle adjusted clock signal to a divider circuit. The apparatus sweeps the frequency of the clock signal from a starting value up to a maximum frequency above which the divider circuit fails. The apparatus then determines the duty cycle of the duty-cycle adjusted clock signal from the maximum frequency.

14 Claims, 7 Drawing Sheets

U.S. PATENT DOCUMENTS

| | | |
|---|---|---|
| 7,227,809 B2 * | 6/2007 | Kwak ........................ 365/233 |
| 2002/0097035 A1 | 7/2002 | Atallah et al. |
| 2005/0225314 A1 | 10/2005 | Belieau |

OTHER PUBLICATIONS

Tsang, et al.—"Picosecond Imaging Analysis (PICA)"—IBM JRD, vol. 44, No. 4 (Jul. 2000).

Bhatti, et al.—"Duty Cycle Measurement & Correction Using a Random Sampling Technique"; Proceedings of the 48th IEEE Int'l. Midwest Symposium on Circuits & Systems, (Aug. 2005).

IBM—Cell Broadband Engine Architecture, Ver. 1.0 (Aug. 2005).

Mantano—"A 1-Gb/s/pin 512-Mb DDRII SDRAM Using a Digital DLL and a Slew-Rate-Controlled Output Buffer"—downloaded from www.elpida.com on Mar. 13, 2006.

Nam—"An All-Digital CMOS Duty Cycle Correction Circuit with a Duty-Cycle Correction Range of 15-to-85% for Multi-Phase Applications"; IEICE Trans. Electron., vol. E88-C, No. 4 (Apr. 2005).

Page—"IBMs Cell Processor: Preview to Greatness?" (May 15, 2005).

Travis, et al.—"Circuit Conditions Variable-Duty-Cycle Clock"; EDN Access (Feb. 17, 1997).

Boerstler, et al.—U.S. Appl. No. 11/380,982, filed May 1, 2006, for a "Method and Apparatus for On-Chip Duty Cycle Measurement".

Boerstler, et al.—U.S. Appl. No. 11/381,031, filed May 1, 2006, for a "Duty Cycle Measurement Method And Apparatus That Operates In A Calibration Mode And A Test Mode".

Boerstler, et al.—U.S. Appl. No. 11/381,050, filed May 1, 2006, for a "Method and Apparatus For Correcting The Duty Cycle Of A Digital Signal".

* cited by examiner

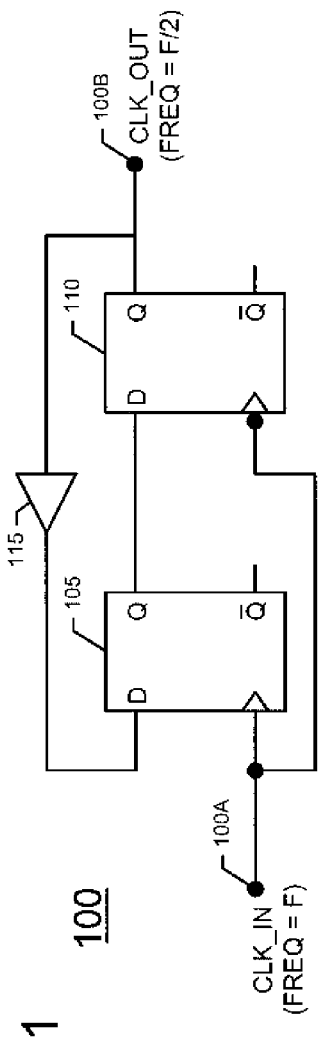
FIG. 1
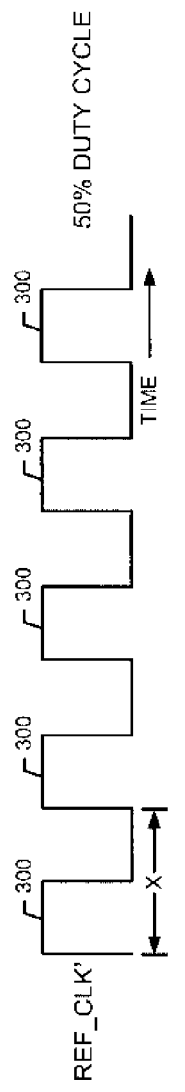
FIG. 3A REF_CLK'
FIG. 3B CLK_IN
FIG. 3C CLK_IN
FIG. 3D CLK_IN
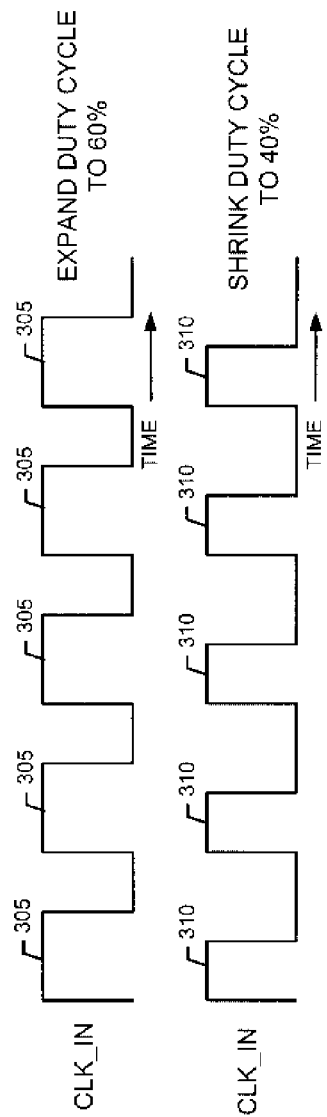

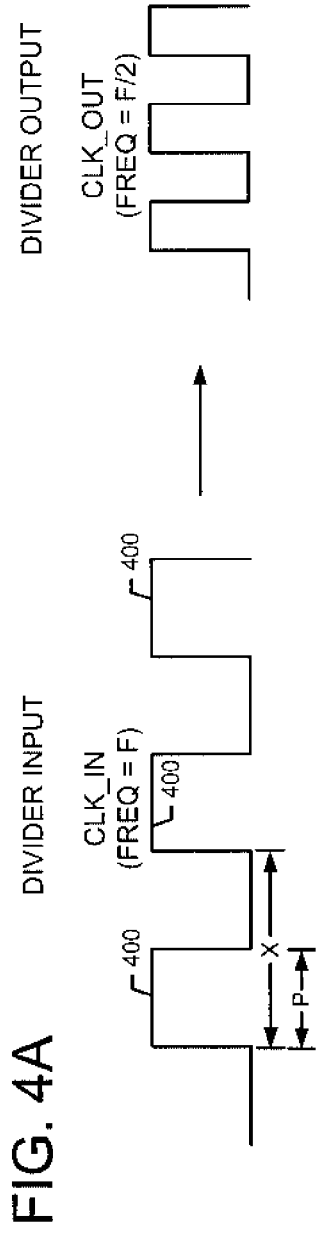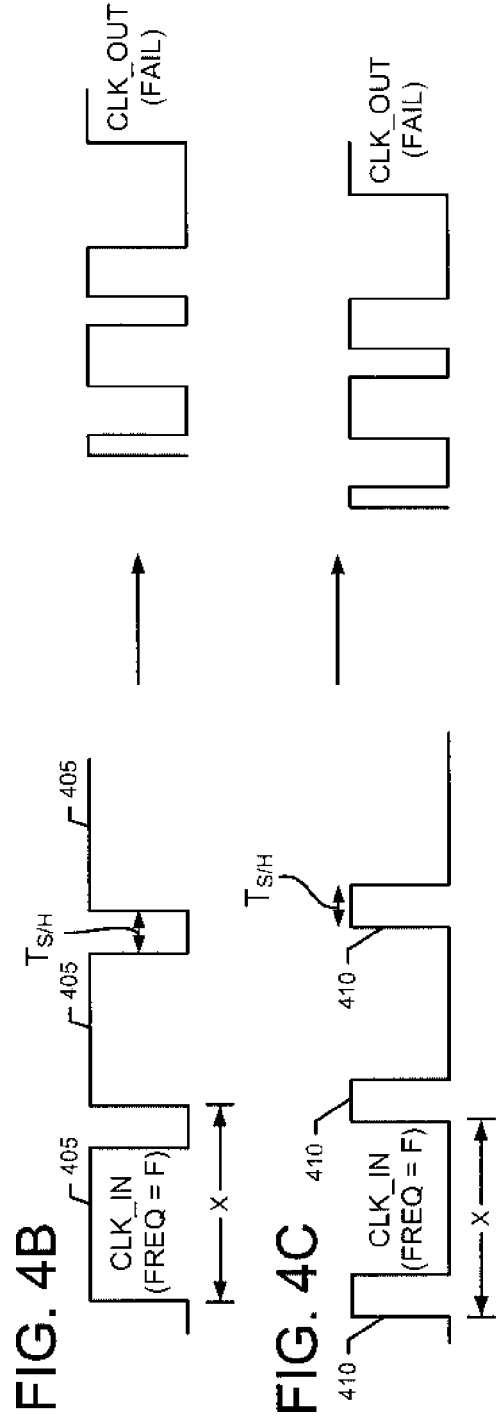
FIG. 4A
FIG. 4B
FIG. 4C

METHOD AND APPARATUS FOR MEASURING THE DUTY CYCLE OF A DIGITAL SIGNAL

CROSS REFERENCE TO RELATED PATENT APPLICATIONS

This patent application is a continuation-in-part of, and claims priority to, the U.S. patent application entitled "Method and Apparatus For On-Chip Duty Cycle Measurement", inventors Boerstler, et al., Ser. No. 11/380,982, filed May 1, 2006 that is assigned to the same Assignee as the subject patent application, the disclosure of which is incorporated herein by reference in its entirety.

This patent application also relates to the U.S. patent application entitled "Duty Cycle Measurement Method And Apparatus That Operates In A Calibration Mode And A Test Mode", inventors Boerstler, et al., Ser. No. 11/381,031, filed May 1, 2006 and assigned to the same assignee, the disclosure of which is incorporated herein by reference in its entirety.

This patent application also relates to the U.S. patent application entitled "Method and Apparatus For Correcting The Duty Cycle Of A Digital Signal", inventors Boerstler, et al., Ser. No. 11/381,050, filed May 1, 2006 and assigned to the same assignees, the disclosure of which is incorporated herein by reference in its entirety.

TECHNICAL FIELD OF THE INVENTION

The disclosures herein relate generally to digital systems, and more particularly, to a method and apparatus that measure the duty cycle of a variable duty cycle digital signal.

BACKGROUND

Some conventional clock signal generator circuits allow the user or designer to vary the duty cycle of a clock signal that the circuit produces. During a clock period, a clock signal exhibits a logic high for a portion of the period and a logic low for the remainder of the period. Duty cycle refers to the percentage of a clock period that the clock signal exhibits a particular logic state (e.g. a logic high). A signal that exhibits a logic high state for 50% of the signal period corresponds to a 50% duty cycle. Similarly, a signal that exhibits a logic high state for 40% of a signal period corresponds to a 40% duty cycle. Of course, the designer or user may alternatively employ inverted logic and define the duty cycle in terms of the percentage of a signal period that the signal exhibits a logic low state.

At relatively low frequencies up to and including the MHz range, it is not difficult to measure incremental changes or adjustments to the duty cycle of a digital signal. However, when dealing with clock circuits in the GHz range, the designer experiences significantly more difficulty in measuring small changes in the duty cycle of a digital signal. In terms of time instead of frequency, incremental adjustments to the clock duty cycle or pulse duration in the picosecond range are very difficult to measure.

One solution for measuring changes to the duty cycle of a clock signal in the picosecond range is a high speed oscilloscope with very large bandwidth. Unfortunately, a laboratory set up with a multi-GHz scope is expensive to implement and maintain. Moreover, care must be taken to assure that whatever circuitry couples the clock signal from a logic chip to the scope does not introduce jitter exceeding the duration of the incremental adjustment to the duty cycle.

Another approach to measuring changes to the duty cycle of a clock signal on an integrated circuit (IC) is picosecond imaging circuit analysis (PICA). The PICA method detects photons of light emitted on the leading and trailing edges of clock pulses to determine their duty cycle. While this type of duty cycle analysis does work, it is extremely expensive. Moreover, this type of analysis destroys the component under test.

What is needed is a duty cycle measurement method and apparatus that address the problems discussed above.

SUMMARY

Accordingly, in one embodiment, a method is disclosed for determining duty cycle information related to a clock signal that a variable duty cycle circuit processes. The method includes providing, by a clock signal generator, a clock signal to the variable duty cycle circuit. In response, the variable duty cycle circuit provides an output signal that exhibits a duty cycle dependent on a duty cycle index. The output signal exhibits a first frequency. The method also includes providing, by the variable duty cycle circuit, the output signal to a divider circuit which fails at a maximum frequency dependent on the duty cycle index. The method further includes sweeping, by the clock signal generator, the frequency of the clock signal from the first frequency up to a second frequency above which divider circuit failure occurs. The method still further includes determining duty cycle information for the output signal from the second frequency.

In another embodiment, a duty cycle measurement system is disclosed that determines the duty cycle of a digital signal. The duty cycle measurement system includes a clock signal generator that generates a clock signal exhibiting a first frequency and a first duty cycle. The system also includes a variable duty cycle circuit, coupled to the clock signal generator, that receives the clock signal exhibiting the first duty cycle. In response, the variable duty cycle circuit outputs a clock signal exhibiting a second duty cycle that is dependent on a duty cycle index. The system further includes a divider circuit, coupled to the variable duty cycle circuit, that fails at a maximum frequency dependent on the duty cycle index. In one embodiment, the system includes a controller, coupled to the clock signal generator, that varies the frequency of the clock signal from the first frequency up to a second frequency above which divider circuit failure occurs. The system still further includes an indicator, coupled to the clock signal generator and the divider, that indicates the second frequency above which the divider circuit fails. The controller determines duty cycle information from the second frequency indicated by the indicator.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 1 shows one divider circuit that the disclosed duty cycle measurement (DCM) apparatus may employ.

FIGS. 3A-3D show clock signals exhibiting respective duty cycles as modified by a variable duty cycle circuit in the disclosed apparatus.

FIGS. 4A-4C show divider input and divider output signal under different operating conditions.

DETAILED DESCRIPTION

Figure 2:
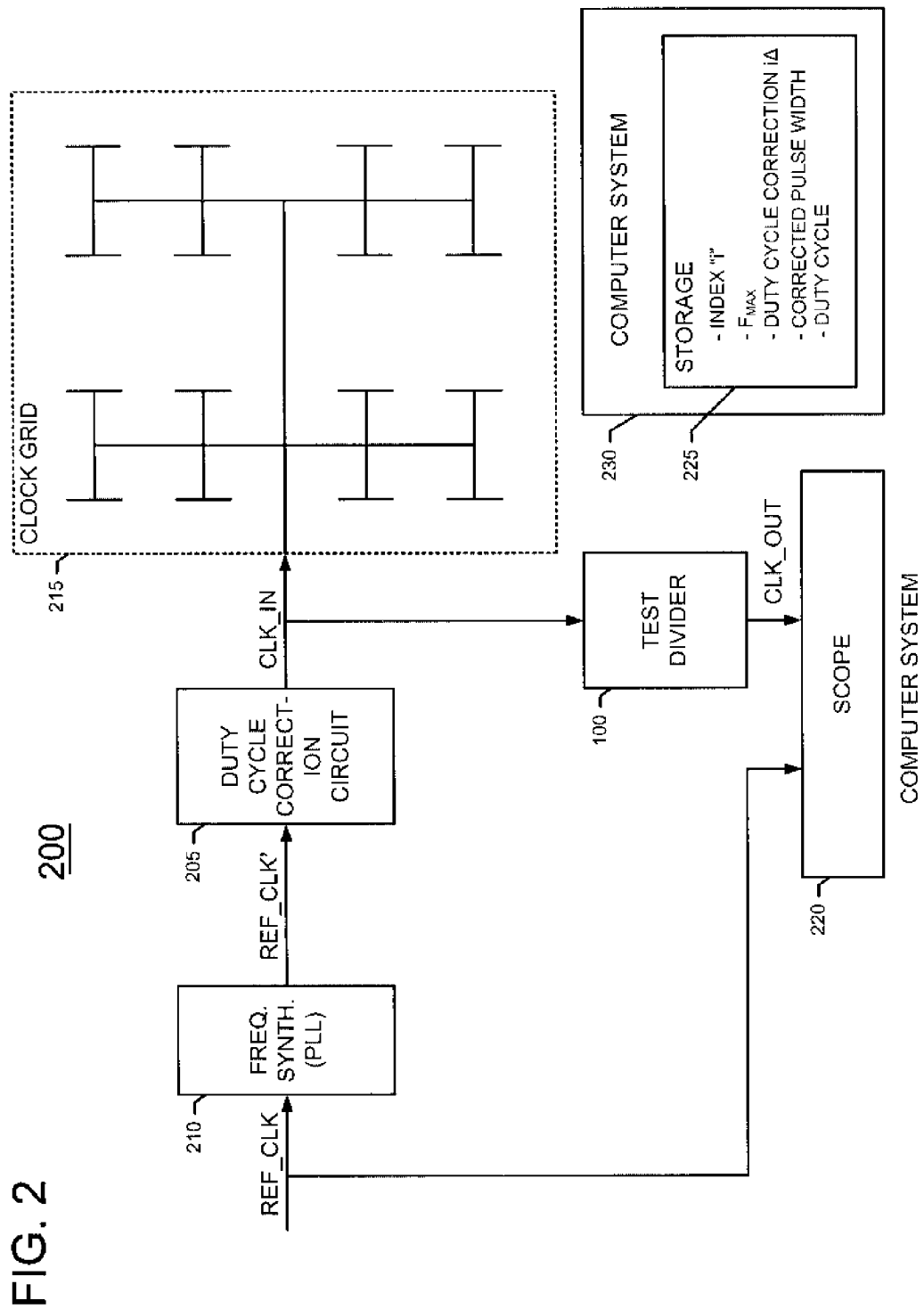
FIG. 2 shows one embodiment of the disclosed duty cycle measurement (DCM) apparatus.

In one embodiment, the disclosed apparatus and methodology provide a way to determine the duration of relatively small incremental changes in the duty cycle of a digital signal. While the disclosed apparatus is especially useful for measurements in the Gigahertz range, i.e. approximately 1 GHz and above, it may also measure incremental changes to the duty cycle of lower frequency digital signals.

In one embodiment, the disclosed methodology employs characteristics of a failed divider circuit, at the frequency where the divider circuit fails, to determine the duration of an incremental change or correction to the duty cycle of a clock signal. FIG. 1 shows a representative divider circuit 100 that includes an input 100A and an output 100B. Divider circuit 100 receives a digital signal exhibiting a predetermined frequency at its input 100A and provides a divided-down version of that digital signal at output 100B. Divider circuit 100 includes latches 105 and 110. The clock input of latch 105 couples to divider input 100A to receive a clock signal, CLK_IN, exhibiting a frequency F. The clock input of latch 105 couples to the clock input of latch 110 such that each latch clock input receives the same CLK_IN signal. The Q output of latch 105 couples to the D input of latch 110. The Q output of latch 110 couples via inverter 115 to the D input of latch 105. The Q output of latch 110 also couples to output 100B of divider circuit 110. In this configuration, divider circuit 100 provides an output signal, CLK_OUT, at divider output 100B that exhibits a frequency, F/2, namely one half the frequency of the CLK_IN signal at input 100A. Latches 105 and 110 have a setup and hold requirement, namely a predetermined amount of time that a clock pulse must remain on the clock input of a latch to enable the latch to latch data at the latch's D input. If the CLK_IN signal that divider circuit 100 receives violates the setup and hold requirement, then divider circuit 100 fails. When divider circuit 100 fails, the CLK_OUT signal that divider circuit 100 produces is not equal to a divided down signal, but rather some other waveform.

FIG. 2 shows one embodiment of a system 200 that measures the incremental duty cycle correction, delta (Δ), that a duty cycle correction (DCC) circuit 205 imparts to a clock signal to alter the duty cycle thereof. More particularly, system 200 includes a frequency synthesizer 210 that receives a reference clock signal, REF_CLK, from a reference clock source (not shown). Frequency synthesizer 210 includes a conventional phase lock loop (PLL), voltage controlled oscillator (VCO) and divider circuitry that enables frequency synthesizer 210 to generate an output signal, REF_CLK', at some multiple (M) times the frequency of the REF_CLK signal.

Duty cycle correction (DCC) circuit 205 is a variable duty cycle circuit that receives the REF_CLK' signal from frequency synthesizer 210. In response to the REF_CLK' signal, DCC circuit 205 supplies a CLK_IN signal at its output that is a function of the REF_CLK' signal at its input. DCC circuit 205 may increase or decrease the duty cycle of the REF_CLK' signal to generate the CLK_IN signal. Alternatively, DCC circuit 205 may leave the REF_CLK' signal unaltered and pass the REF_CLK' signal through to the output of DCC circuit 205 as the CLK_IN signal.

FIG. 3A shows a representative 50% duty cycle pulse signal, namely a clock signal REF_CLK' that DCC circuit 205 may receive at its input. This pulse signal includes multiple pulses 300 that correspond to logic highs. A logic low follows each pulse 300 or logic high as shown. The pulse signal exhibits a period, X, namely the time between the beginning of one pulse 300 and the following pulse 300. The pulse signal of FIG. 3A exhibits a logic high for 50% of each pulse period and thus this pulse signal exhibits a 50% duty cycle. When DCC circuit 205 leaves the duty cycle of the REF_CLK signal unaltered, then the CLK_IN signal at the output of DCC circuit 205 also exhibits a 50% duty cycle such as shown in FIG. 3B. If DCC circuit 205 increases the duty cycle of the REF_CLK' signal that it receives, then the pulses 305 of the CLK_IN signal at the output of the DCC circuit exhibit a longer duration than the corresponding pulses 300 at the DCC circuit input. For example, the CLK_IN pulses 305 of FIG. 3C exhibit an expanded duty cycle of 60%. However, If DCC circuit 205 decreases the duty cycle of the REF_CLK' signal that it receives, then the pulses 310 of the CLK_IN signal at the output of the DCC circuit exhibit a shorter duration than the corresponding pulses 300 at the DCC circuit input. In this instance, DCC circuit 205 effectively shrinks the duty cycle of digital pulses it receives. For example, the CLK_IN pulses 310 of FIG. 3D exhibit a reduced duty cycle of 40%.

DCC circuit 205 may thus either expand or shrink the pulse width of pulses 300 that it receives. In one embodiment, the smallest correction to the pulse width that DCC circuit 205 can provide is delta (Δ) picoseconds (pS), namely the incremental duty cycle correction unit. A correction index "i" defines the number of incremental duty cycle correction units Δ that DCC circuit 205 will apply to a particular digital signal it receives. With a correction index "i", the DCC circuit provides pulse width change or correction equal to i*Δ picoseconds. The disclosed apparatus and method enables the determination of the incremental correction Δ for each correction index "i" by using observations with respect to when divider circuit 100 fails as explained in more detail below.

The output of DCC circuit 205 couples to the input of a clock grid 215. Clock grid 215 distributes the corrected clock signal, namely an altered duty cycle clock signal, CLK_IN, to a number of functional blocks (not shown) that couple to clock grid 215. These functional blocks may include digital logic such as that found in processors, coprocessors, digital logic as well as other electrical circuits. In one embodiment, system 200 also includes the test divider circuit shown above in FIG. 1 as divider circuit 100. Test divider 100 couples to the output of DCC circuit 205 to receive the CLK_IN corrected or altered clock signal therefrom. The output of test divider 100 couples to one input of oscilloscope 220 to deliver a CLK_OUT signal thereto. A remaining input of oscilloscope 220 couples to the input of frequency synthesizer 210. In this manner, oscilloscope 220 receives both the REF_CLK signal and the CLK_OUT signal that test divider 100 generates. In another embodiment, scope 220 receives the REF'CLK signal from the output of frequency synthesizer 210.

An internal VCO divider in frequency synthesizer 210 exhibits a setting of 2 such that frequency synthesizer 210 generates a 50% duty cycle signal, REF_CLK' it its output. Thus, the input of DCC correction circuit 205 receives a 50% duty cycle clock signal in this instance. In response, DCC circuit 205 adjusts the pulse waveform of the 50% duty cycle signal by a predetermined amount of time to generate the CLK_IN signal at the output of DCC circuit 205. Test divider circuit 100 receives this CLK_IN signal from DCC circuit 205 and attempts to divide the CLK_IN signal by a predetermined divisor or factor. In this particular example, the divisor is 2 while other divisor values may also be satisfactory depending upon the particular application.

FIG. 4A shows the CLK_IN signal prior to divider action. FIG. 4A also shows the CLK_OUT signal after divider action, namely the divided-down version of the clock signal. In this particular example, divider circuit 100 successfully divided the CLK_IN signal to form the CLK_OUT signal as seen by inspection of the CLK_OUT waveform in FIG. 4A. When divider 100 successfully conducts its division operation, the resultant CLK_OUT waveform is in sync with the CLK_IN signal at the input of the divider and is also in sync with the reference clock signal, REF_CLK. In this case wherein divider 100 is successful, the duration P of pulse 400 is not so long or short as to cause test divider 100 to fail. However, at some frequencies the duration P of pulse 400 becomes so long or short that the pulse waveform violates the setup and hold threshold time, $T_{S/H}$, of divider 100. In response, divider 100 fails to divide.

For example, as seen in FIG. 4B, when the pulses 405 become so long in duration that the time between pulses 405 is equal to or less than $T_{S/H}$, then divider 100 fails. In other words, the resultant output signal of divider 100, namely CLK_OUT, is not a divided down version of CLKN_IN, but rather is a corrupt version thereof. The lack of synchronism between the CLK_OUT signal and the REF_CLK signal provides an indicator that divider 100 failed for this particular CLK_IN waveform. In a similar manner, at some frequencies the duration P of pulse 400 becomes so short that it violates the setup and hold threshold time, $T_{S/H}$, of divider 100. In response, divider 100 fails to divide. For example, as seen in FIG. 4C, when the pulses 410 become equal to or less than $T_{S/H}$ in duration, then divider 100 fails. In other words, the resultant output signal of divider 100, namely CLK_OUT, is not a divided down version of CLK_IN, but rather is a corrupt version thereof. Again, the lack of synchronism between the CLK_OUT signal and the REF_CLK signal provides an indicator that divider 100 failed for this particular CLK_IN waveform.

As described above, in one embodiment the RF_CLK' signal that the DCC circuit 205 receives exhibits a 50% duty cycle. X is the period of the REF_CLK' signal that DCC circuit 205 receives. In this case X is also the period of the CLK_IN signal at the output of DCC circuit 205 because the DCC circuit does not alter the period of the signal waveform processed thereby. The smallest correction that DCC circuit 205 may introduce is $\Delta$ picoseconds (pS). At correction index "i", the DCC circuit provides a correction equal to i*$\Delta$ pS. In one embodiment, correction $\Delta$ is one of 10 pS, 20 pS, 30 pS, 40 pS, 50 pS, 60 pS and −10 pS, −20 pS, −30 pS, −40 pS, −50 pS, −60 pS. The designer or user may also select other correction settings depending upon the particular application. For a given correction index setting "i", the pulse width P of the CLK_IN signal at the output of DCC 205 is given by Equation 1 below.

Equation 1

$$P = X/2 + i*\Delta$$

If test divider 100 exhibits a setup/hold time equal to $T_{S/H}$, then when P equals $T_{S/H}$ or when P equals X−$T_{S/H}$, the divider fails. In one embodiment, the disclosed methodology uses the above relationship to experimentally extract the duty cycle correction introduced by DCC circuit 205 for each duty cycle setting. DCC circuit 205 will introduce a different duty cycle correction for each value of i*$\Delta$. For a given DCC setting i, the minimum CLK_IN clock period, $X_{MIN}$, that causes divider 100 to fail is given by replacing P in Equation 1 with $T_{S/H}$. Solving for $X_{MIN}$ yields Equation 2 namely, Equation 2

$$X_{MIN}(i) = [2(T_{S/H} - i*\Delta)]$$

Thus for a given correction index "i", the maximum allowed frequency (FMAX) at which divider 100 will operate before failure is given by the Equation 3 below:

Equation 3

$$F_{MAX}(i) = 1/X_{MIN}(i) = 1/[2(T_{S/H} - i*\Delta)]$$

And thus,

Equation 4

$$X_{MIN}(i+1) - X_{MIN}(i) = -2i*\Delta$$

This recursive Equation 4 is solvable for all correction indexes "i" to find the correction $\Delta$ corresponding to each index i.

A user, designer or other person can observe scope 220 to determine the FMAX frequency for each index setting "i". For a particular index "i", DCC circuit 205 sends a CLK_IN signal exhibiting a duty cycle correction of i*$\Delta$ to divider 100 as an input signal. The width of the CLK_IN pulse is thus the original REF_CLK' pulse width plus i*$\Delta$. To observe the divider at frequencies below and at the point of failure, scope 220 receives the divider output signal, CLK_OUT, and triggers off the reference clock signal, REF_CLK. As seen in FIG. 2, scope 220 receives both the divided down CLK_OUT signal and the REF_CLK signal on which the scope triggers. If the divider did not yet fail, and the PLL in frequency synthesizer 210 is currently locked, then the reference clock, REF_CLK, and the divided down CLK_OUT signal from divider 100 are synchronous with one another. When REF_CLK and CLK_OUT are synchronous with one another, a scope user or operator can readily determine this condition by observing a fixed phase relationship between the 2 signals on the scope. However, when divider 100 fails, such as when the CLK_IN signal exceeds $F_{MAX}$ for a particular index i, REF_CLK and CLK_OUT are no longer synchronous with a fixed phase relationship therebetween. Rather, when divider 100 fails, the divider output exhibits a free running characteristic.

Figure 5:
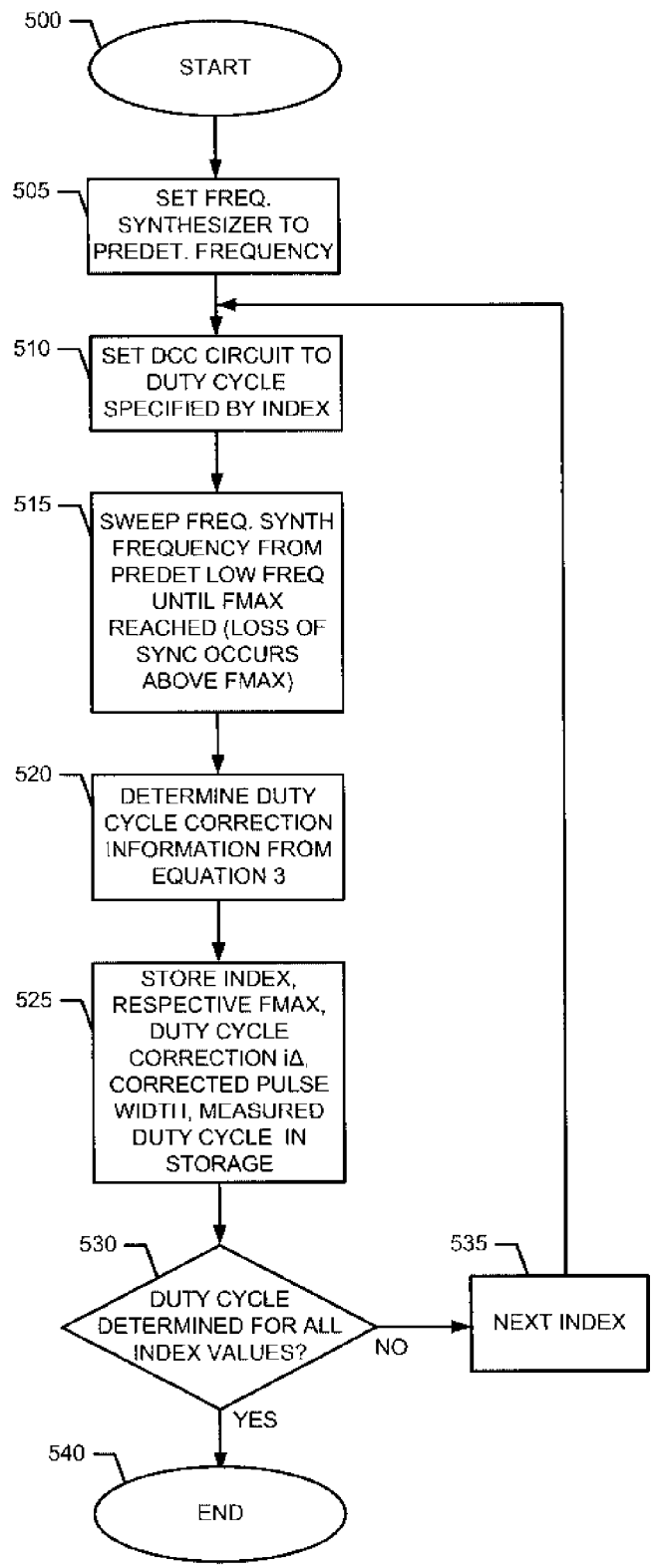
FIG. 5 shows a flowchart that summarizes the operation of one embodiment of the disclosed duty cycle measurement apparatus.

FIG. 5 shows a flowchart that depicts the steps that system 200 employs to characterize or determine the duty cycle of a high speed clock signal such as those that frequency synthesizer 210 and DCC circuit 205 provide. Process flow begins at start block 500. An operator, or alternatively a computer controlled apparatus, sets the frequency of frequency synthesizer 210 to a predetermined initial frequency, as per block 505. The predetermined initial frequency is sufficiently low that it does not result in a pulse width so small that it causes divider 100 to fail. Then, as per block 510, DCC circuit 205 applies a duty cycle correction equal to an initial value that the current correction index specifies. In one embodiment, system 200 may start with a correction index of i=0 that corresponds to zero duty cycle correction by DCC circuit 205, as per block 510. If DCC circuit receives a 50% duty cycle input signal and it applies zero duty cycle correction when index i=0, then the resultant signal at the output of DCC circuit 205 also exhibits a 50% duty cycle. In other words, the pulse width of the CLK_IN signal that divider 100 receives is the same as the pulse width of the REF_CLK' signal at the input of DCC circuit 205. For discussion purposes, assume that the pulse duration of the CLK_IN signal provided by DCC circuit 205 is 100 pS at a 50% duty cycle. The pulse signal period is thus 200 pS of which half of the time the pulse signal exhibits the logic high state and the remaining half of the period the pulse signal exhibits the logic low state. In other words, the pulse itself exhibits a 100 pS duration while the total pulse period is 200 pS.

With the duty cycle thus set according to the initial correction index of i=0, the system operator may manually or with computer assistance sweep the frequency of the REF_CLK' signal that synthesizer 210 generates from a low predetermined value (e.g. 200 MHz) to higher and higher frequencies until the frequency reaches $F_{MAX}$. The operator monitors scope 220 during this sweep to determine at which frequency loss of sync occurs between the CLK_OUT signal and the REF_CLK signal. $F_{MAX}$ is the maximum frequency at which synchronism still exists between CLK_OUT and REF_CLK for a particular duty cycle correction value or index "i". The operator records $F_{MAX}$ manually or via computer assistance along with index "i" and the amount of duty cycle correction. A table or database in storage 225 within computer system 230 provides one convenient way to store each index i and the corresponding $F_{MAX}$ value. The operator may manually or with the assistance of computer system 230 substitute the $F_{MAX}$ value and corresponding "i" value into Equation 3 to determine the $\Delta$, as per block 520. In this particular example wherein the correction index "i" is zero, DCC circuit 205 adds no duty cycle correction i$\Delta$ to the pulse that DCC circuit 205 provides to divider 100. In one embodiment, storage 225 stores the index "i", the corresponding $F_{MAX}$, the determined or solved $\Delta$ and duty cycle correction i$\Delta$ in storage 225, as per block 525. To determine the actual pulse width for a given correction index "i", the operator may manually, or with assistance from computer system 230, add the duty cycle correction i$\Delta$ to the pulse width of the REFL_CLK' pulse that DCC circuit 205 receives at its input. To determine the actual duty cycle for a given correction index "i", the operator may manually or with computer assistance divide the corrected pulse width by the period of the pulse signal. Storage 225 may also store this duty cycle value along with the corresponding correction index "i".

Decision block 530 performs a test to determine if system 200 completely tested divider 100 for all values of correction index "i". If other indexes "i" remain that system 200 did not yet test, then system 200 proceeds to the next correction index "i", as per block 535. For example, once system 200 completes testing for index "i"=0, system 200 increments the index and proceeds to the next positive index "i"=1. DCC circuit 205 sets to the next duty cycle that correction index "i"=1 specifies as per block 510. System 200 performs the frequency sweep again as per block 515 and determines duty cycle correction information as per block 520. System 200 then stores the duty cycle correction information as before, as per block 525. System 200 then tests at decision block 520 and advances to the next positive correction index as per block 535. The process continues until system 200 tests all positive correction indexes "i" and stores the respective duty cycle correction information for each such index. When testing of the positive corrective indexes "i" completes, then system 200 continues testing for all negative values of the corrective index "i". When decision block 530 determines that system 200 completed testing for all corrective indexes "i", then process flow ends as per block 540.

Figure 6:
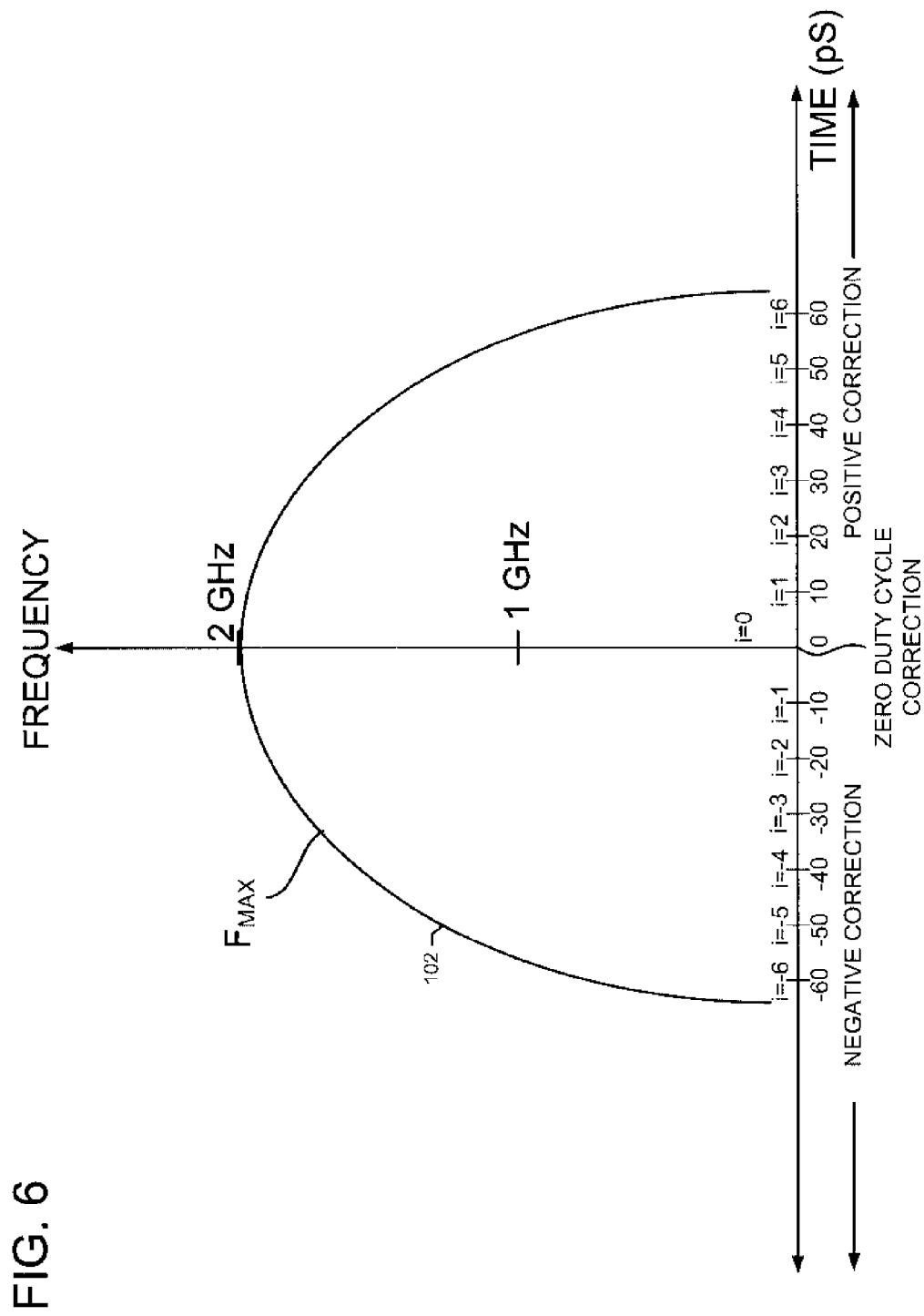
FIG. 6 shows a frequency vs. time graph that depicts a maximum operating frequency without divider failure for multiple duty cycle values.

FIG. 6 is a graph that shows typical $F_{MAX}$ values for each corrective index "i" for which system 200 tests. The x axis shows time in picoseconds (pS) and the y axis shows frequency in gigahertz (GHz). The data depicted in FIG. 6 form an inverted parabolic curve that shows the maximum frequency at which divider 100 successfully operates without failing for each value of correction index, i. The maximum value of $F_{MAX}$ occurs at zero duty cycle correction, namely when the clock signal exhibits a 50% duty cycle at correction index i=0.

Figure 7:
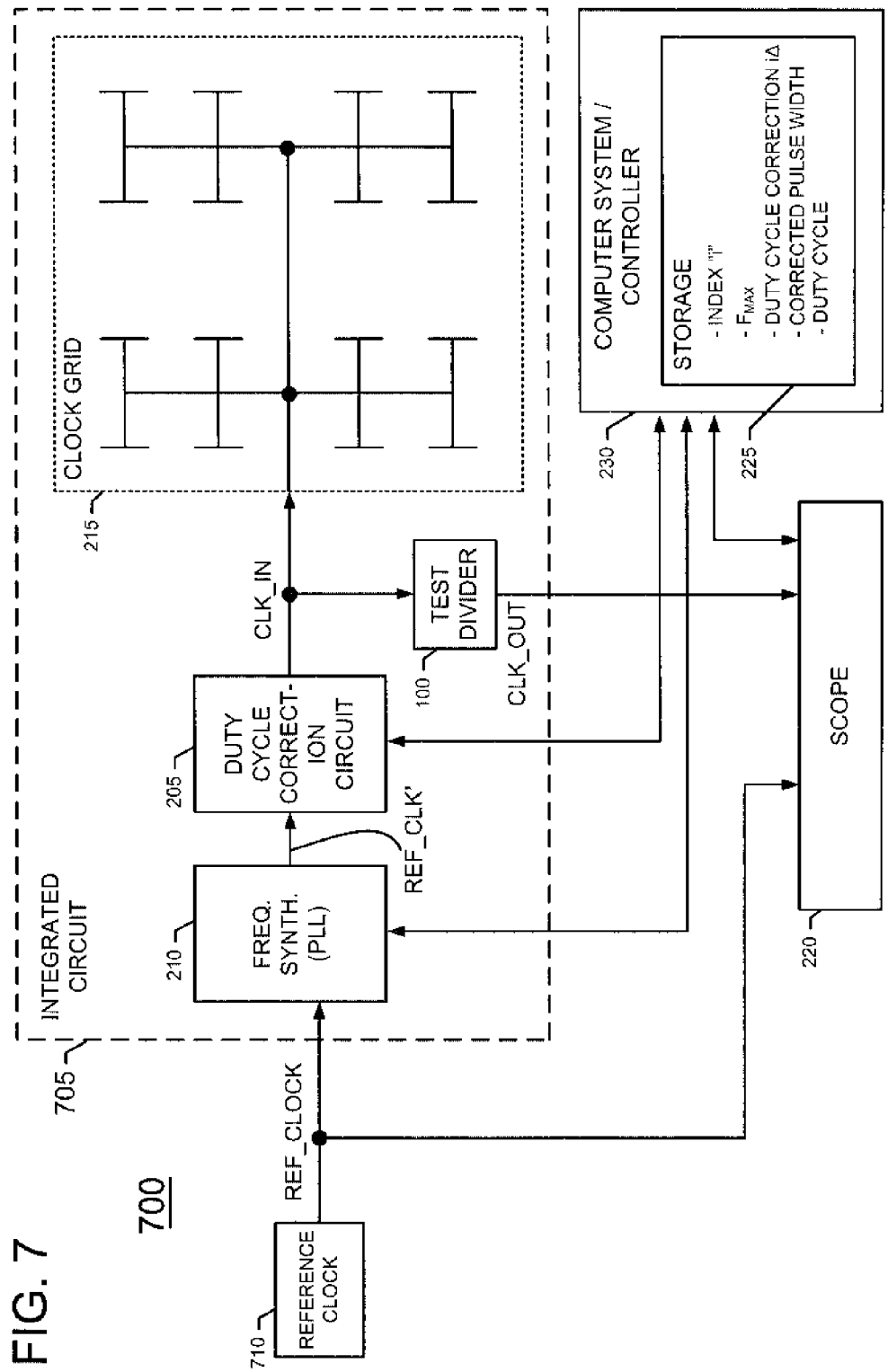
FIG. 7 shows another embodiment of the disclosed duty cycle measurement (DCM) apparatus.

FIG. 7 shows a system 700 similar to system 200 of FIG. 2 with like component numbers indicating like elements. However, system 700 includes an integrated circuit 705 that employs duty cycle correction (DCC) circuit 205, frequency synthesizer 210, clock grid 215 and test divider 100. Integrated circuit 705 may be a processor, multi-processor, co-processor, digital signal processor (DSP) or any other digital logic circuit for which duty cycle measurement is desirable. In system 700, computer system/controller 230 acts as a controller that controls frequency synthesizer 210, DCC circuit 205 and scope 220 to carry out the steps in the FIG. 6 flowchart. More specifically, computer system/controller 230 couples to DCC circuit 205 to provide correction index values "i" to DCC circuit 205 that instruct DCC circuit 205 regarding the particular duty cycle index it should employ at different times during testing, namely a different index for each $F_{MAX}$ frequency sweep. Computer system/controller 230 also couples to frequency synthesizer 210 to sweep the frequency of the REF_CLK' signal from low frequencies to higher frequencies until divider 100 fails, for each correction index value "i", as described above. Computer system/controller 230 also couples to scope 220 to monitor for loss of sync between the REF_CLK and CLK_OUT signal during the respective frequency sweep for each correction index "i". FIG. 7 also shows a reference clock 710 that couples to frequency synthesizer 210 to provide the reference clock signal, REF_CLK, thereto. Computer system 230 includes the computational capability to solve equations 1-4 to determine the actual duty cycle for each correction index value "i", as described above. The system operator may perform these computations manually, or for greater efficiency, computer system/controller 230 may perform these manipulations of the data as equations 1-4 specify. In one embodiment, storage 225 stores each correction index "i" and the corresponding respective $F_{MAX}$, duty cycle correction i$\Delta$, corrected pulse width and duty cycle.

Figure 8:
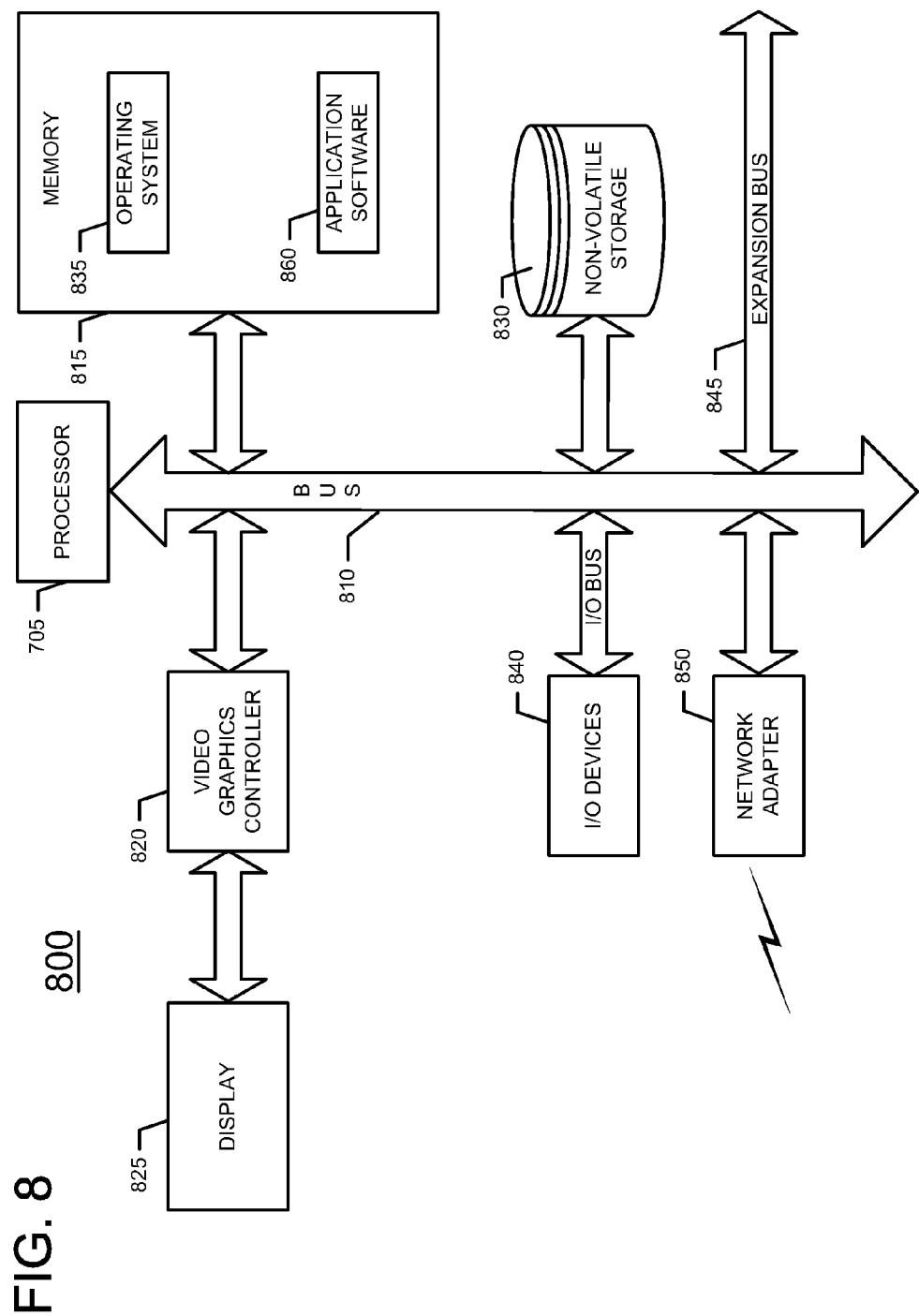
FIG. 8 shows an information handling system (IHS) that employs a processor that uses the disclosed duty cycle measurement apparatus.

FIG. 8 shows an information handling system (IHS) 800 that employs integrated circuit 705 of FIG. 7 as a processor for the IHS. In this example, integrated circuit 705 includes the functional blocks (not shown) typically associated with a processor such an instruction decoder, execution units, load/store units as well as other functional units. Reference clock 710, scope 220 and computer system/controller 230 (not shown in FIG. 8) may couple to integrated circuit processor 705 to perform the duty cycle measurements described above. IHS 800 further includes a bus 810 that couples processor 705 to system memory 815 and video graphics controller 820. A display 825 couples to video graphics controller 820. Nonvolatile storage 830, such as a hard disk drive, CD drive, DVD drive, or other nonvolatile storage couples to bus 810 to provide IHS 800 with permanent storage of information. An operating system 835 loads in memory 815 to govern the operation of IHS 800. I/O devices 840, such as a keyboard and a mouse pointing device, couple to bus 810. One or more expansion busses 845, such as USB, IEEE 1394 bus, ATA, SATA, PCI, PCIE and other busses, couple to bus 810 to facilitate the connection of peripherals and devices to IHS 800. A network adapter 850 couples to bus 810 to enable IHS 800 to connect by wire or wirelessly to a network and other information handling systems. While FIG. 8 shows one IHS that employs processor 705, the IHS may take many forms. For example, IHS 800 may take the form of a desktop, server, portable, laptop, notebook, or other form factor computer or data processing system. IHS 800 may take other form factors such as a gaming device, a personal digital assistant (PDA), a portable telephone device, a communication device or other devices that include a processor and memory. While system 800 of FIG. 8 is an information handling system, computer system/controller 230 of FIG. 7 is itself a form of information handling system.

The foregoing discloses an information handling system (IHS) that in one embodiment measures the duty cycle of digital signals such as clock signals. In one embodiment the disclosed system measures the duty cycle of a clock signal that undergoes duty cycle correction or adjustment by a variable duty cycle correction circuit.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of determining duty cycle information for a variable duty cycle circuit, the method comprising:
   providing, by a clock signal generator, a clock signal to the variable duty cycle circuit, the variable duty cycle circuit in response providing an output signal which exhibits a duty cycle dependent on a duty cycle index, the output signal exhibiting a first frequency;
   providing, by the variable duty cycle circuit, the output signal to a divider circuit which fails at a maximum frequency dependent on the duty cycle index, wherein divider circuit failure occurs when the divider circuit fails to divide the output signal of the variable duty cycle circuit;
   sweeping, by the clock signal generator, the frequency of the clock signal from the first frequency up to a second frequency above which divider circuit failure occurs;
   determining duty cycle information for the output signal from the second frequency; and
   determining divider circuit failure by a loss of synchronism between the clock signal and a divided output signal of the divider circuit.

2. A method of determining duty cycle information for a duty cycle correction (DCC) circuit, the method comprising:
   providing, by a clock signal generator, a first clock signal exhibiting a duty cycle to the DCC circuit;
   receiving, by the DCC circuit, a plurality of duty cycle indexes;
   generating, by the DCC circuit, a second clock signal for each duty cycle index, the duty cycle of each second clock signal relating to each duty cycle index, respectively;
   receiving, by a divider circuit, the second clock signal, the divider circuit failing at a different maximum frequency for each duty cycle index, wherein divider circuit failure occurs when the divider circuit fails to divide the second clock signal of the DCC circuit and is determined by a loss of synchronism between the first clock signal and a divided output signal of the divider circuit;
   sweeping for each duty cycle index, by the clock signal generator, the frequency of the first clock signal from a first frequency up to second maximum frequency above which divider circuit failure occurs, thus providing a second maximum frequency value corresponding to each duty cycle index, respectively; and
   determining, from the second maximum frequency value corresponding to each duty cycle index, duty cycle information corresponding to each respective duty cycle index.

3. A duty cycle measurement system comprising:
   a clock signal generator that generates a clock signal exhibiting a first frequency and a first duty cycle;
   a variable duty cycle circuit, coupled to the clock signal generator, that receives the clock signal exhibiting the first duty cycle and which in response outputs a clock signal exhibiting a second duty cycle that is dependent on a duty cycle index;
   a divider circuit, coupled to the variable duty cycle circuit, that fails at a maximum frequency dependent on the duty cycle index;
   a controller, coupled to the clock signal generator, that varies the frequency of the clock signal from the first frequency up to a second frequency above which divider circuit failure occurs; and
   an indicator, coupled to the clock signal generator and the divider, that indicates the second frequency above which the divider circuit fails, wherein the controller determines duty cycle information from the second frequency indicated by the indicator.

4. The duty cycle measurement system of claim 3, wherein the indicator comprises an oscilloscope.

5. The duty cycle measurement system of claim 3, wherein the controller determines duty cycle information, Δ, from the relationship:

$$FMAX=1/[2(T_{S/H}-i*\Delta)]$$

wherein FMAX is the second frequency and $T_{S/H}$ is a setup and hold threshold time of the divider circuit.

6. The duty cycle measurement system of claim 3, wherein the controller provides a plurality of duty cycle indexes to the variable duty cycle circuit and the controller instructs the clock signal generator to sweep the frequency of the clock signal from the first frequency to a different second frequency for each duty cycle index provided to the variable duty cycle circuit.

7. The duty cycle measurement system of claim 3, wherein the indicator indicates divider circuit failure when the clock signal exhibiting the first duty cycle loses synchronism with an output signal of the divider circuit.

8. The duty cycle measurement system of claim 3, wherein the duty cycle generator circuit generates a clock signal exhibiting a second duty cycle of approximately 50%.

9. An information handling system (IHS) comprising:
   a processor situated on an integrated circuit (IC), the IC including a duty cycle measurement (DCM) circuit;
   a memory coupled to the processor;
   the DCM circuit including:
      a clock signal generator that generates a clock signal exhibiting a first frequency and a first duty cycle;
      a variable duty cycle circuit, coupled to the clock signal generator, that receives the clock signal exhibiting the first duty cycle and which in response outputs a clock signal exhibiting a second duty cycle that is dependent on a duty cycle index;
      a divider circuit, coupled to the variable duty cycle circuit, that fails at a frequency dependent on the duty cycle index;
   the IHS further comprising:
      a controller, coupled to the clock signal generator, that varies the frequency of the clock signal from the first frequency up to a second frequency above which divider circuit failure occurs; and
      an indicator, coupled to the clock signal generator and the divider, that indicates the second frequency above which the divider circuit fails, wherein the controller determines duty cycle information from the second frequency indicated by the indicator.

10. The IHS of claim 9, wherein the indicator comprises an oscilloscope.

11. The IHS of claim 9, wherein the controller determines duty cycle information, $\Delta$, from the relationship:

$$F\text{MAX}=1/[2(T_{S/H}-i^*\Delta)]$$

wherein FMAX is the second frequency and $T_{S/H}$ is a setup and hold threshold time of the divider circuit.

12. The IHS of claim 9, wherein the controller provides a plurality of duty cycle indexes to the variable duty cycle circuit and the controller instructs the clock signal generator to sweep the frequency of the clock signal from the first frequency to a different second frequency for each duty cycle index provided to the variable duty cycle circuit.

13. The IHS of claim 9, wherein the indicator indicates divider circuit failure when the clock signal exhibiting the first duty cycles loses synchronism with an output signal of the divider circuit.

14. The IHS of claim 9, wherein the duty cycle generator circuit generates a clock signal exhibiting a second duty cycle of approximately 50%.

* * * * *